(12) United States Patent
Tigelaar et al.

(10) Patent No.: US 8,581,317 B2
(45) Date of Patent: Nov. 12, 2013

(54) SOI MUGFETS HAVING SINGLE GATE ELECTRODE LEVEL

(75) Inventors: Howard Tigelaar, Allen, TX (US); Cloves Rinn Cleavelin, Dallas, TX (US); Andrew Marshall, Dallas, TX (US); Weize Xiong, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 361 days.

(21) Appl. No.: 12/199,041

(22) Filed: Aug. 27, 2008

(65) Prior Publication Data

US 2010/0052025 A1 Mar. 4, 2010

(51) Int. Cl.
*H01L 27/115* (2006.01)

(52) U.S. Cl.
USPC .................................. 257/298; 257/E27.103

(58) Field of Classification Search
USPC ................... 275/E29.275, 300, 347, 350–351
See application file for complete search history.

(56) References Cited

U.S. PATENT DOCUMENTS

| | | | | |
|---|---|---|---|---|
| 3,383,570 A | * | 5/1968 | Luscher | 327/208 |
| 5,541,442 A | * | 7/1996 | Keil et al. | 257/533 |
| 6,487,112 B1 | * | 11/2002 | Wasshuber | 365/163 |
| 2006/0001025 A1 | * | 1/2006 | Park et al. | 257/66 |
| 2006/0113605 A1 | * | 6/2006 | Currie | 257/368 |

* cited by examiner

Primary Examiner — David Vu
Assistant Examiner — Jonathan Han
(74) Attorney, Agent, or Firm — Rose Alyssa Keagy; W. James Brady; Frederick J. Telecky, Jr.

(57) ABSTRACT

A silicon on insulator (SOI) multi-gate field effect transistor electrically Programmable Read-Only Memory (MuFET EPROM) includes a substrate having a dielectric surface. A first semiconducting region is in or on the dielectric surface. A source region, a drain region and a channel region interposed between the source and drain are formed in first semiconducting region. A gate dielectric layer is on the channel region. At least a second semiconducting region in or on the dielectric surface is spaced apart from the first semiconducting region. A first electrode layer comprises a first electrode portion including a transistor gate electrode and a control gate electrode electrically isolated from one another. The transistor gate overlies the channel region to form a transistor. The control gate extends to overlay a portion of the second semiconducting region. The transistor gate and thus the transistor and the control gate are capacitively coupled to one another by at least one MOS coupling capacitor, with one plate of the MOS coupling capacitor ohmically coupled to or including the second semiconducting region.

19 Claims, 6 Drawing Sheets

SOI MUGFETS HAVING SINGLE GATE ELECTRODE LEVEL

FIELD OF THE INVENTION

Embodiments of the present invention relate to integrated circuits including EPROMs, and more specifically integrated circuits including EPROMs formed on semiconductor on insulator (SOI) substrates.

BACKGROUND

Erasable Programmable Read-Only Memory (EPROM) is one known form of non-volatile memory. Electrically Erasable Programmable Read-Only Memory (EEPROM or $E^2$PROM) is a related type of non-volatile memory. As used herein, references to EPROM include both EPROM and EEPROM. EPROMs and EEPROMs are generally realized as arrays of conventional floating-gate transistors. The conventional floating gate or "double gate" transistor is a transistor arrangement that is commonly used for non-volatile storage such as flash, EPROM and EEPROM memory. Floating-gate metal-oxide semiconductor field-effect transistors (MOSFETs) comprise a conventional MOSFET and one or more capacitors stacked thereon that are used to couple control voltages to the floating gate. A dielectric, generally an oxide, surrounds the floating gate, so that any charge trapped on the floating gate generally remains there. The charge stored on the floating gate can be modified by applying voltages to the source, drain, body and control gate terminals of the MOSFET, such that the electric fields generated result in phenomena such as Fowler-Nordheim tunneling and hot carrier injection. The extra gate in the conventional double gate structure represents several additional process steps as compared to a conventional MOSFET process.

There is frequently a requirement to incorporate memory in VLSI chips. However, with shrinking device geometries, devices including memory devices such as EPROMs have begun to experience undesirable short channel effects, especially "off-state" leakage current, which increases the idle power required. What is needed is a low leakage EPROM design that is also area efficient, and adds little or no extra processing steps.

SUMMARY

This Summary is provided to comply with 37 C.F.R. §1.73, presenting a summary of the invention briefly indicating the nature and substance of the invention. It is submitted with the understanding that it will not be used to interpret or limit the scope or meaning of the claims.

Embodiments of the invention provide a Multigate Field Effect Transistor (MuGFET) EPROM design that is generally area efficient, only generally needs a single gate electrode layer, and adds little or no extra processing steps. As used herein, a MuGFET refers to a MOSFET comprising device in which a plurality of gate contacts is used to control the output current of the MOSFET device. The multiple gates may be controlled by a single gate electrode, such as for non-planar FinFET or trigate embodiments, wherein the multiple gate surfaces act electrically as a single common gate, or by independent gate electrodes. FinFET or trigate embodiments can also be embodied with multiple gate lines, where each gate line forms a FinFET or trigate, such as a multi-fin FinFET.

A MuGFET-EPROM comprises a substrate having a dielectric surface, a first semiconducting region in or on the dielectric surface. A source region, a drain region and a channel region interposed between the source and said drain are formed in the first semiconducting region. A gate dielectric layer is on the channel region. At least a second semiconducting region in or on the dielectric surface is spaced apart from the first semiconducting region. A first electrode layer comprises a first electrode portion including a transistor gate electrode and a control gate electrode electrically isolated from one another. The transistor gate overlies the channel region to form a transistor, and the control gate extends to overlay a portion of the second semiconducting region. The transistor gate (and thus the transistor) and the control gate are capacitively coupled to one another by at least one MOS coupling capacitor, with one plate of the MOS coupling capacitor ohmically coupled to or including the second semiconducting region.

In one embodiment, the transistor gate is ohmically connected to the second semiconducting region, and one plate of the MOS coupling capacitor comprises the control gate. In another embodiment, the control gate is ohmically connected to the second semiconducting region and one plate of the coupling capacitor comprises the first gate electrode portion.

An integrated circuit (IC) can comprise an array of MuGFET-EPROMs according to an embodiment of the invention. The IC can also include memory cells other than EPROMs, such as ROMs, SRAMs or DRAMs.

DETAILED DESCRIPTION

Figure 1A:
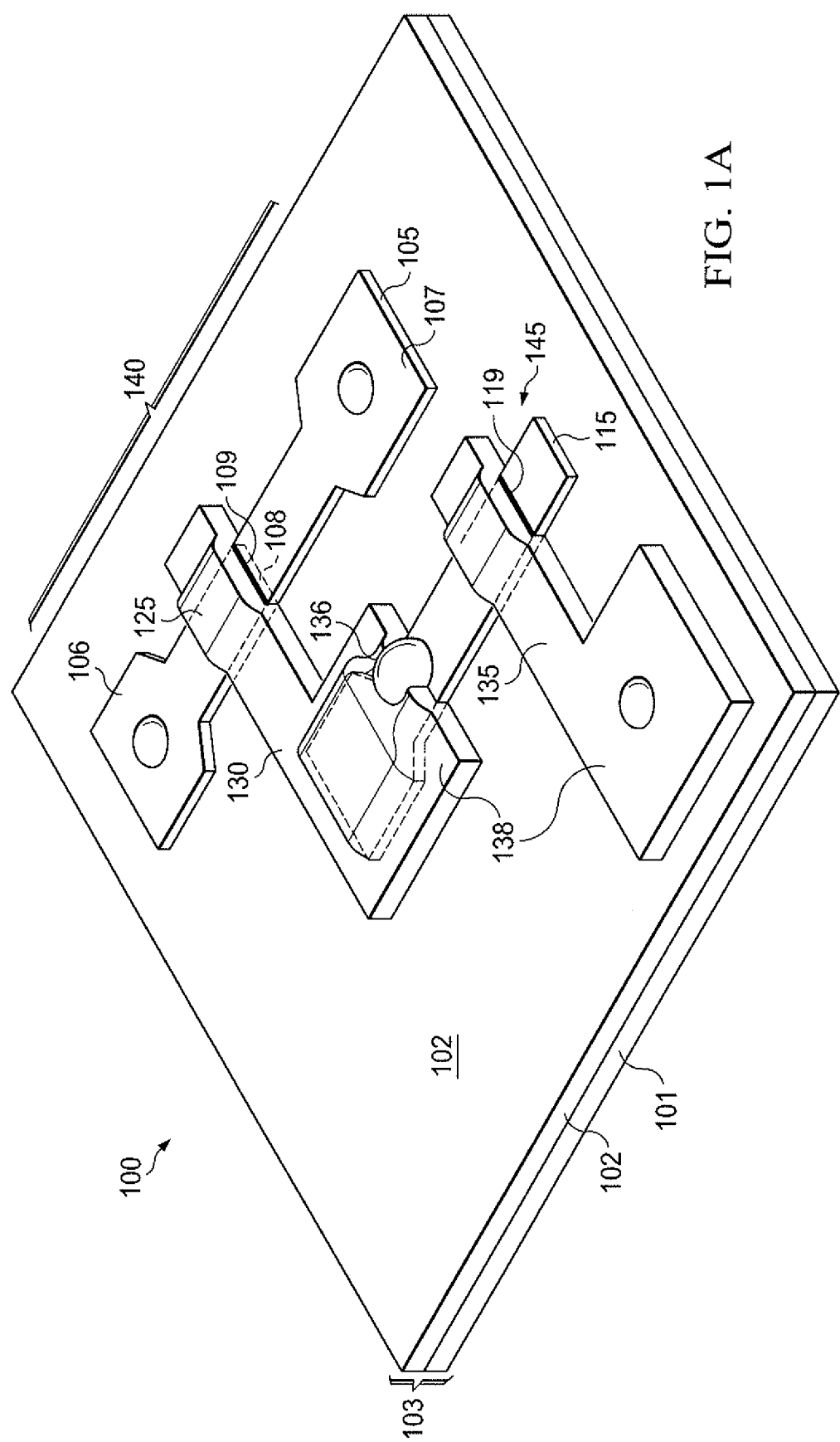
FIG. 1A is a perspective enhanced layout view of a semiconductor on insulator (SOI) multi-gate field effect transistor electrically Programmable Read-Only Memory (MuFET EPROM), according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A is a perspective enhanced layout view of a SOI MuGFET EPROM cell 100, according to an embodiment of the invention. MuGFET EPROM cell 100 comprises a single transistor 140 and a control gate 135 that is capacitively coupled by at least one coupling capacitor to the transistor 140. The transistor 140 is generally described herein as being an NMOSFET, but can also be a PMOSFET. The coupling capacitor 145 comprises a MOS capacitor. A single electrode layer 138 provides both a first electrode portion 130 that includes the transistor gate electrode 125 and a control gate electrode 135. First electrode portion 130 and control gate 135 are electrically isolated from one another by the dielectric layer 102.

The EPROM 100 comprises a substrate 103 comprising a support layer 101, and a dielectric layer 102 on the support layer 101. Dielectric layer 102 can comprise a silicon oxide, such as silicon dioxide. In FIG, 1A, first semiconducting region 105 and second semiconducting region 115 are shown on top of and thus raised above the surface of the dielectric layer 102 (referred to herein as the non-planar embodiment with the semiconductor regions 105, 115 being on the dielectric surface of dielectric layer 102). However, as described below relative to FIG. 3A and 3B, in other embodiments of the invention the respective semiconducting regions (shown as semiconducting regions 305 and 315 in FIGS. 3A and 3B) are in the dielectric layer and thus planarized with the dielectric surface of the dielectric layer 102 (referred to herein as the planar embodiment with the semiconductor regions being in the dielectric layer 102).

The second semiconducting region 115 is spaced apart and thus dielectric-ally isolated by dielectric layer 102 from the first semiconducting region 105. Second semiconducting region 115 is formed from the same material and generally has the same thickness as the first semiconducting region 105. In one embodiment, the first 305 and second semiconducting regions 115 comprise silicon, Substrate 103 can comprise a variety of SOI substrates. A conventional SOI substrate comprises a relatively thick support layer 101 (e.g. silicon) having a dielectric layer 102 thereon embodied as a silicon oxide layer, and a thin surface semiconducting (e.g. silicon) layer on the silicon oxide layer upon which one or more transistors are formed per semiconducting region (105, 115). Embodiments of the present invention include a thickness for semiconducting regions 105 and 115 to implement either partially-depleted SOI (PD-SOI) or fully-depleted SOI (FD-SOI) technology. As known in the art, in PD-SOI, the thickness of the active semiconducting (e.g. silicon) layer is greater than the depletion width under the gate, leaving a neutral region that extends down to the underlying dielectric layer 102, while for FD-SOI, the active semiconducting layer is thin enough so that the depletion width extends completely to the underlying dielectric layer 102. In partially-depleted SOI (PD-SOI) technology, the surface silicon thickness in semiconducting regions 105 and 115 is currently generally>1,000 A, while for fully-depleted SOI (FD-SOI) technology, the thickness in semiconducting regions 105 and 115 is currently generally <500 A.

Transistor 140 comprises source region 106, drain region 107, and a channel region 108 interposed between the source 106 and drain 107 all formed within the first semiconducting region 105. The gate dielectric layer is shown as 109, which is generally referred to as a tunneling dielectric (e.g. oxide or oxynitride) layer, which is positioned on the channel region 108. The transistor gate 125 is on the tunneling dielectric 109 which provides the gate electrode for transistor 140.

As described above, a single electrode layer 138 provides both the first electrode portion 130 which comprises the transistor gate 125, as well as the control gate 135. The first electrode portion 130 is shown extending over the second semiconducting region 115. The single electrode layer 138 can comprise polysilicon having an optional silicide layer thereon to form polysilicon gate transistors, or a metal in the case of replacement gate metal gate transistors. The transistor gate 125 and control gate 135 for MuGFET EPROM 100 are thus realized with a single electrode layer 138 provided by a single process level, in contrast to conventional stacked double gate EPROMs which require two electrode (e.g. polysilicon) layers and process levels to form the respective gates.

The control gate 135 extends to overlay a portion of the second semiconducting region 115. A dielectric layer 119 is interposed between the control gate 135 and the second semiconducting region 115 in their overlap region to form a MOS capacitor 145, referred to below as a MOS coupling capacitor based on its function for MuGFET EPROM 100.

A contact 136 is provided to ohmically couple the first electrode layer 130 and thus the transistor gate 125 to the second semiconducting region 115. Contact 136 is shown as a stretch contact. The transistor gate 125 and the control gate 135 are thus capacitively coupled to one another by coupling capacitor 145.

Figure 1B:
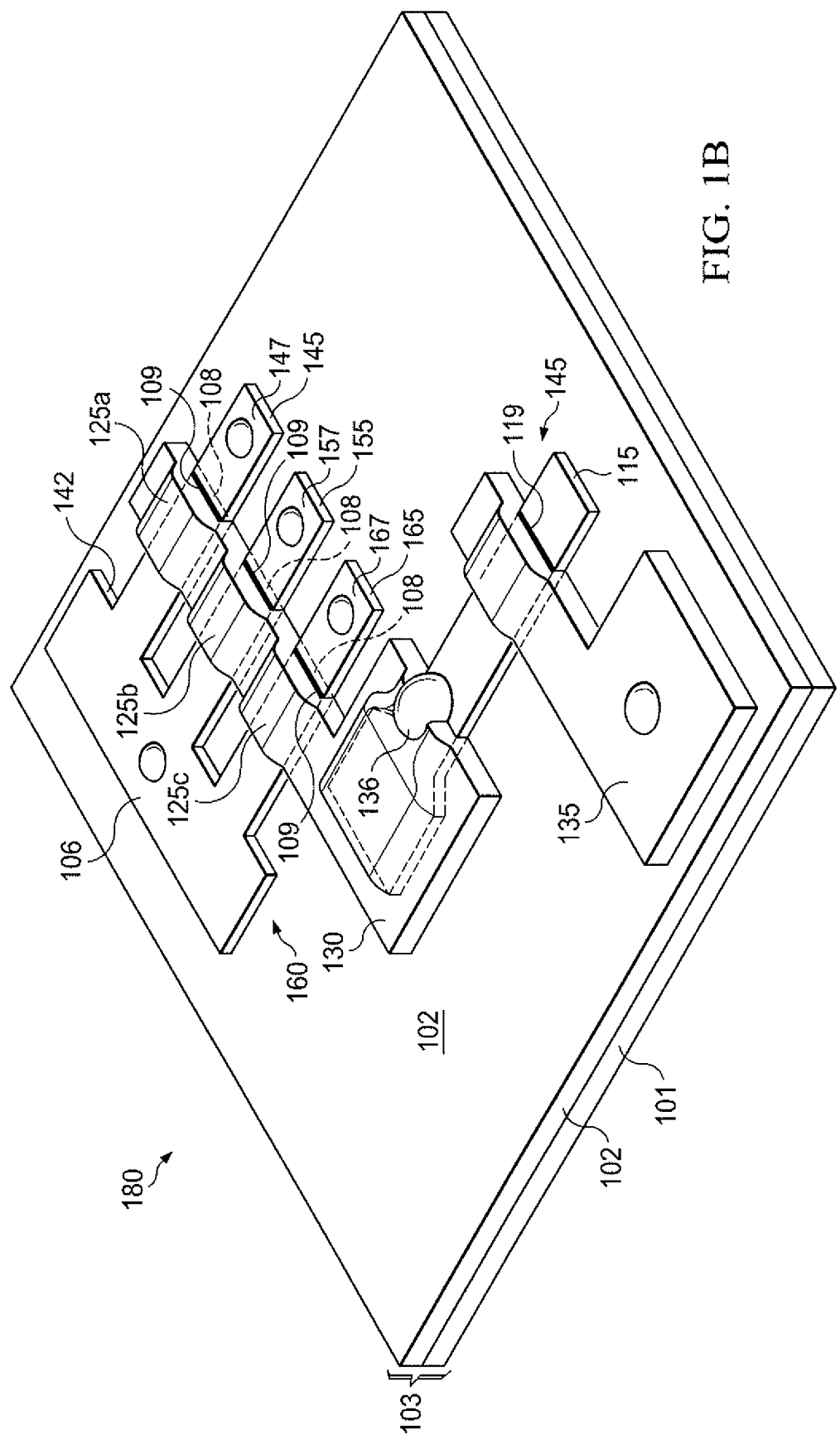
FIG. 1B is a perspective layout view of a SOI MuFET EPROM that comprises a transistor structure having multiple fins, according to an embodiment of the invention.

FIG. 1B is a perspective enhanced layout view of a SOI MuGFET EPROM 180 that comprises a transistor structure 160 in which the first silicon region 105 in FIG. 1A is replaced by first silicon region 142 that includes multiple fins 145, 155 and 165, according to an embodiment of the invention. Drains 147, 157 and 167 are formed in fins 145, 155 and 165, respectively. Source 106 is formed in first silicon region 142. Although not shown, source 106 can also be divided into a plurality of sources 106(a), 106(b) and 106(c). The first electrode layer 130 provides a single gate electrode trace that provides transistor gate electrodes 125(a), 125(b) and 125(c).

Figure 2:
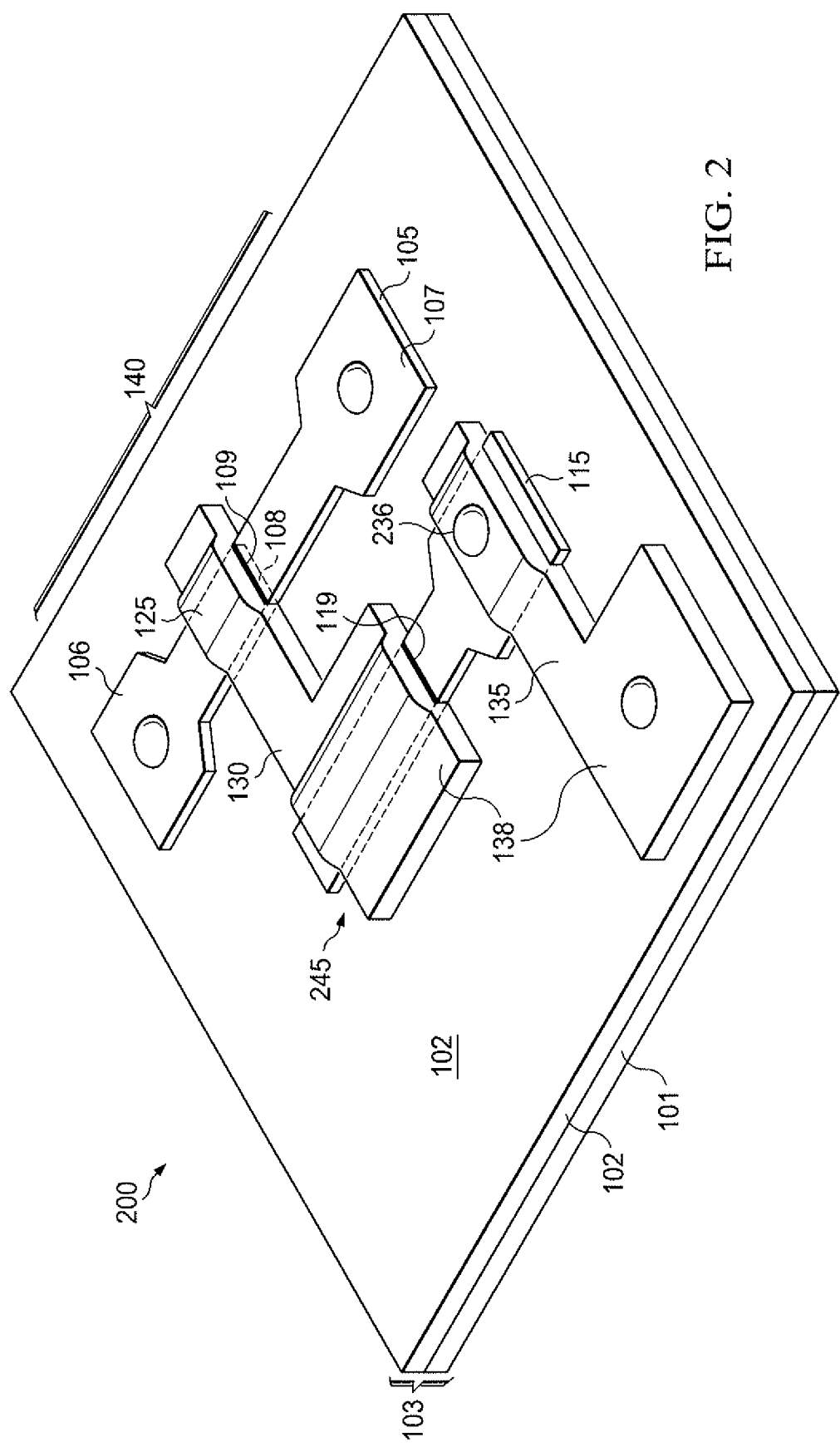
FIG. 2 is a perspective enhanced layout view of an SOI MuFET EPROM, according to another embodiment of the invention.

FIG. 2 is a perspective enhanced layout view of a SOI MuGFET EPROM cell 200, according to another embodiment of the invention. In contrast to MuGFET EPROM 100 in which the transistor gate 125 is ohmically connected to the second semiconducting region 115 which is capacitively coupled to the control gate 135, as described below for MuGFET EPROM 200 the transistor gate 125 is capacitively coupled to the second semiconducting region 115, and is thus a floating gate. The second semiconducting region 115 is ohmically connected to the control gate 135.

MuGFET EPROM 200 comprises MOS coupling capacitor 245. One plate of coupling capacitor 245 is provided by the first electrode layer 130 and its second plate is provided by the second semiconducting region 115. Contact 236 ohmically connects the control gate 135 to the second semiconducting region 115.

Figure 3A:
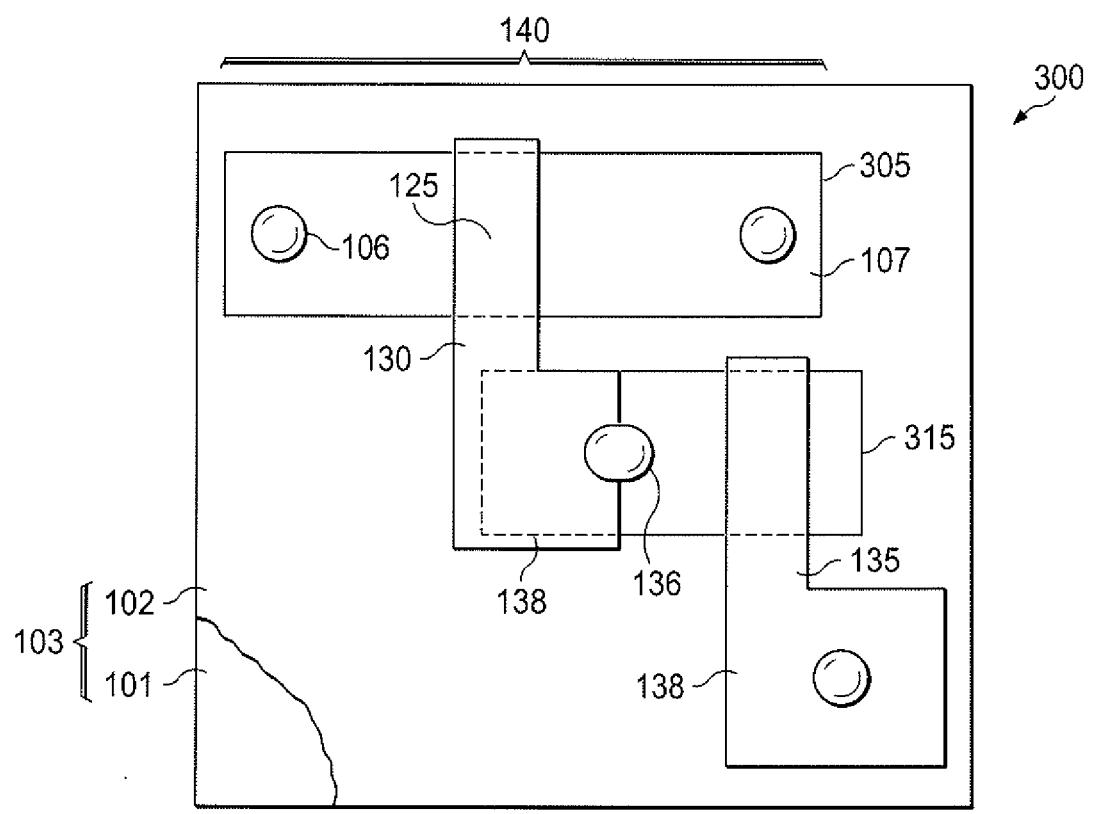
FIG. 3A is a planar layout view for the SOI EPROM shown in FIG. 1A, according to another embodiment of the invention.

FIG. 3A is a layout view for an SOI EPROM 300 according to another embodiment of the invention that comprises a planar layout of the SOI MuGFET EPROM cell 100 shown in FIG. 1A. In this embodiment, the surface of first semiconducting region 305 and second semiconducting region 315 are planarized with the surface of the dielectric layer 102. Standard planar SOI forms are PD-SOI and FD-SOI as described above. Embodiments of the invention can implement either PD-SOI or FD-SOI technology.

Figure 3B:
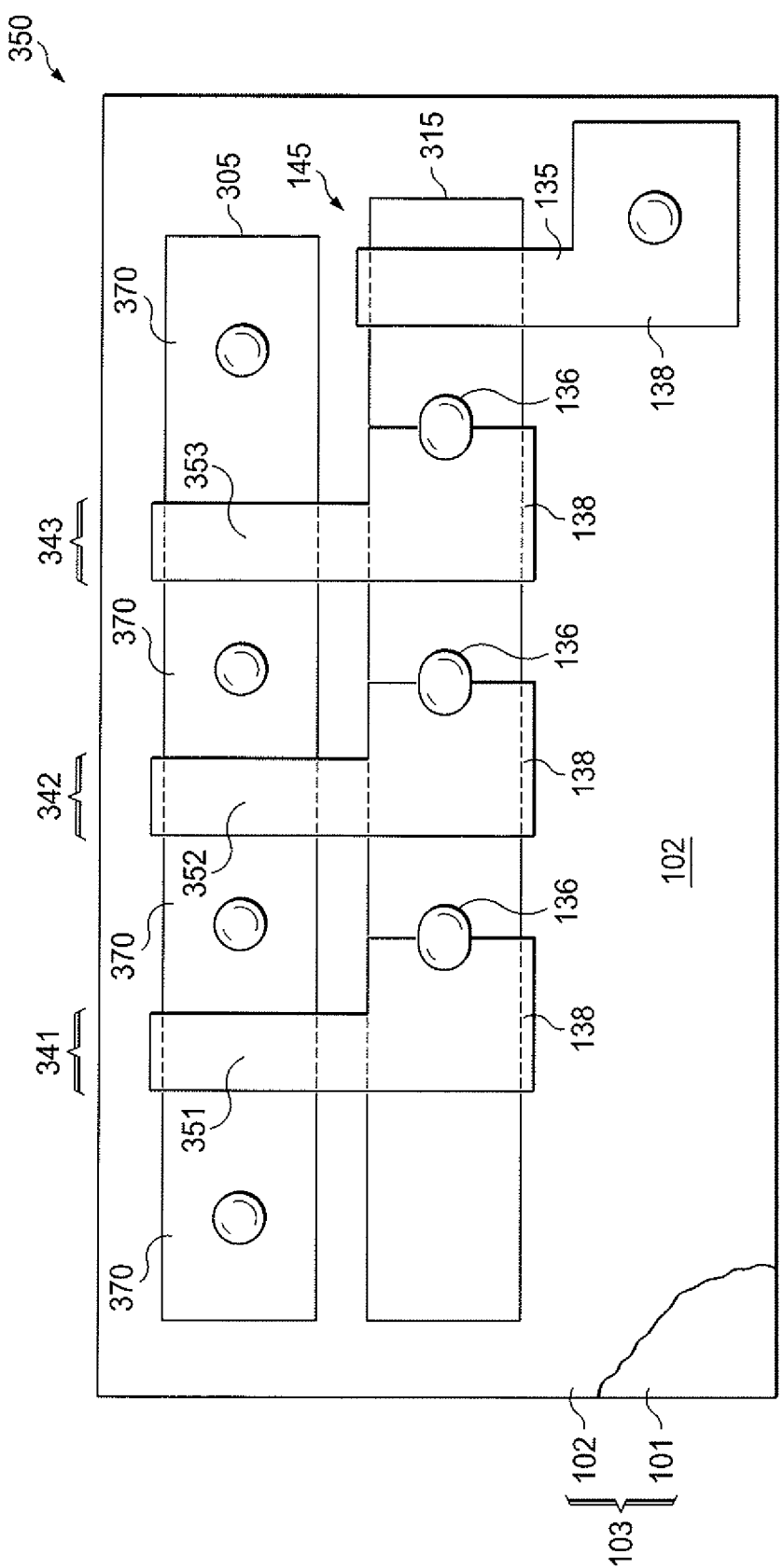
FIG. 3B is a planar layout view for a multiple independent transistor comprising SOI MuFET EPROM, according to another embodiment of the invention, that is shown including three (3) independent transistors.

FIG. 3B is a planar layout view for a multiple independent transistor comprising SOI MuGFET EPROM 350 according to another embodiment of the invention, that is shown including three (3) independent transistors 341, 342 and 343 which include gates 351, 352 and 353, respectively. Source/drain regions are shown as 370. As with EPROM 300 shown in FIG. 3A, the control gate 135 is capacitively coupled to the gate of the transistor, as shown in FIG. 3B to gates 351, 352 and 353.

Figure 4:
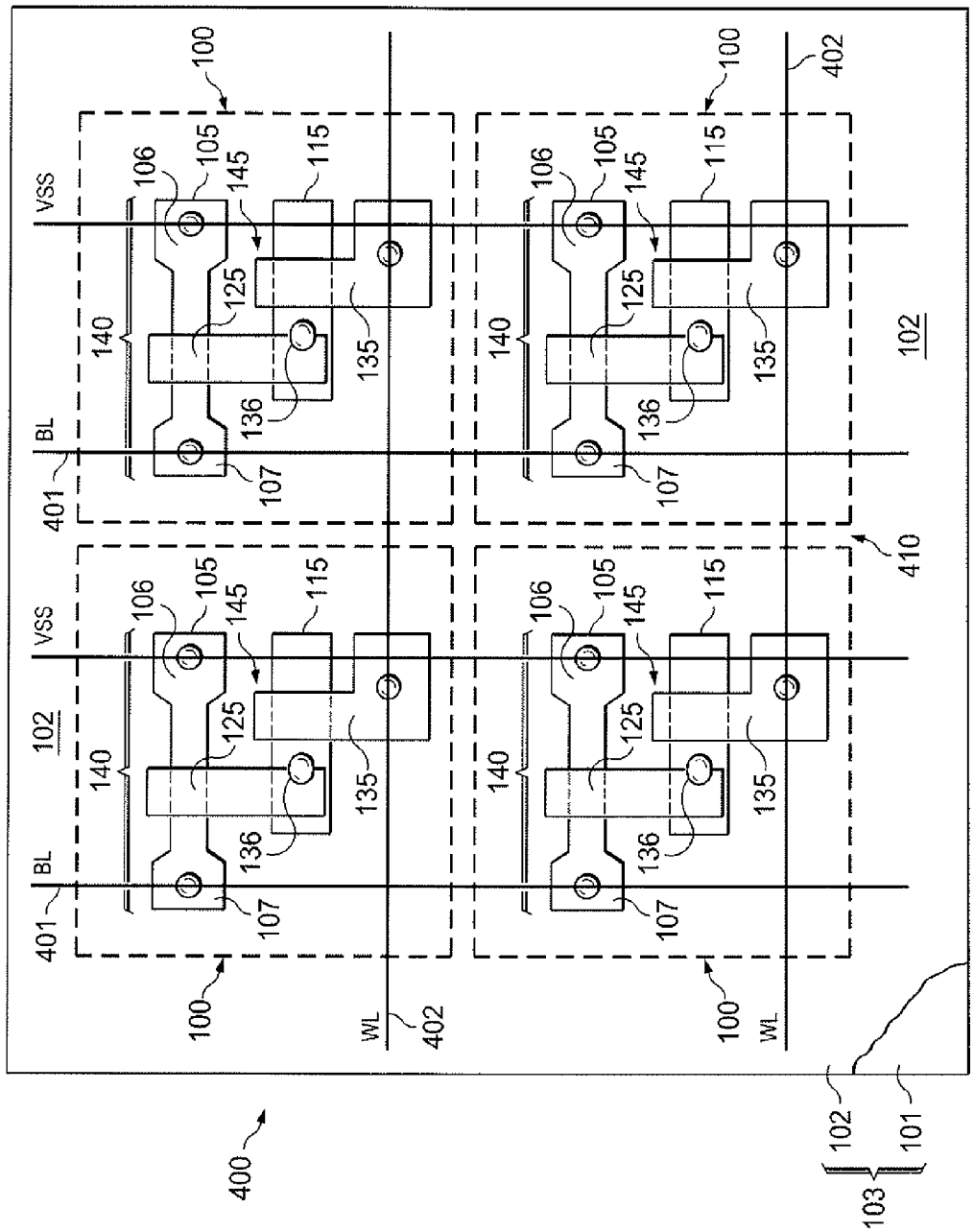
FIG. 4 is a simplified layout representation of an integrated circuit including an SOI-based memory cell array comprising a plurality of MuGFET EPROM cells arranged in rows and columns, according to an embodiment of the invention.

FIG. 4 shows a simplified layout representation of an integrated circuit 400 including a memory cell array 410 comprising a plurality of SOI MuGFET EPROM cells 100 arranged in a plurality of rows and a plurality of columns, according to an embodiment of the invention. The plurality of rows are shown connected via the control gate 135 which is in series with the MOS coupling capacitor 145 and the transistor gates 125 via contacts 136 to each of the plurality of transistors 140 in the array 410 for wordlines (WL) 402 to select or deselect transistors 140 in the array 410 for reading, programming or erasing. The plurality of columns are connected to the drain regions 107 of each of the transistors 140 in the array 410 for bitlines (BL) for applying charge for programming or erasing selected ones of the plurality of transistors in the array 410. The sources 106 of the respective transistors 140 in the array 410 are shown connected to a line indicated as being VSS, which in one embodiment comprises ground.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. For example, there can be two series coupling capacitors instead of one. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A semiconductor on insulator (SOI) multi-gate field effect transistor-based erasable programmable read-only memory (MuGFET-EPROM), comprising:
   a substrate having a dielectric surface;
   a first semiconducting region in or on said dielectric surface,
   a source region, a drain region and a channel region of said MuGFET-EPROM interposed between said source and said drain formed in said first semiconducting region;
   a tunneling dielectric layer on said channel region;
   at least a second semiconducting region in or on said dielectric surface spaced apart from said first semiconducting region, and
   a first electrode layer comprising a first electrode portion including a transistor gate electrode and a second electrode portion including a control gate electrode electrically isolated from one another, said transistor gate overlying said tunneling dielectric layer to form a MOS transistor, and said control gate overlaying a portion of said second semiconducting region;
   wherein said transistor gate and said control gate are capacitively coupled to one another by at least one MOS coupling capacitor having a capacitor dielectric, one plate of said at least one MOS coupling capacitor ohmically coupled to or including said second semiconducting region.

2. The MuGFET-EPROM of claim 1, wherein said transistor gate is ohmically connected to said second semiconducting region, and one plate of said MOS coupling capacitor comprises said control gate.

3. The MuGFET-EPROM of claim 1, wherein said control gate is ohmically connected to said second semiconducting region and one plate of said MOS coupling capacitor comprises said first electrode portion.

4. The MuGFET-EPROM of claim 1, wherein said first and said second semiconducting regions are both positioned on said dielectric surface.

5. The MuGFET-EPROM of claim 4, wherein said transistor comprises a FinFET.

6. The MuGFET-EPROM of claim 4, wherein said transistor comprises a trigate FET.

7. The MuGFET-EPROM of claim 1, wherein said MuGFETEPROM comprises a planar SOI MuGFET-EPROM.

8. The MuGFET-EPROM of claim 7, wherein said planar SOI MuGFET-EPROM comprises a partially depleted SOI MuGFET-EPROM.

9. The MuGFET-EPROM of claim 7, wherein said planar SOI MuGFET-EPROM comprises a fully depleted SOI MuGFET-EPROM.

10. The MuFET-EPROM of claim 1, wherein said transistor gate electrode layer comprises polysilicon.

11. The MuGFET-EPROM of claim 1, wherein said first electrode layer comprises a metal, and said transistor comprises a replacement metal gate transistor.

12. An integrated circuit (IC), comprising:
    a memory array comprising:
    a plurality of semiconductor on insulator (S01) multi-gate field effect transistor-based erasable programmable read-only memory (MuGFET-EPROM) arranged in a plurality of rows and a plurality of columns.
    each of said MuGFET-EPROMs comprising:
       a substrate having a dielectric surface;
       a first semiconducting region in or on said dielectric surface, a source region, a drain region and a channel region interposed between said source and said drain are formed in said first semiconducting region;

a tunneling dielectric layer on said channel region;

at least a second semiconducting region in or on said dielectric surface spaced apart from said first semiconducting region, and a first electrode layer comprising a first electrode portion including a transistor gate electrode and a second electrode portion including a control gate electrode electrically isolated from one another, said transistor gate overlying said tunneling dielectric layer to form a MOS transistor and said control gate overlaying a portion of said second semiconducting region;

wherein said transistor gate and said control gate are capacitively coupled to one another by at least one MOS coupling capacitor having a capacitor dielectric, one plate of said at least one coupling capacitor ohmically coupled to or including said second semiconducting region, wherein said plurality of rows are connected via said control gate and said MOS coupling capacitor to said transistor gate of each of said plurality of transistors for wordlines (WL) to select or deselect respective ones of said plurality of transistors for reading, programming or erasing, and wherein said plurality of columns are connected to said drain regions of each of said plurality of transistors for bitlines (BL) for applying charge for programming or erasing selected ones of said plurality of transistors.

13. The IC of claim 12, said transistor gate electrode is ohmically connected to said second semiconducting region, and one plate of said MOS coupling capacitor comprises said control gate.

14. The IC of claim 12, wherein said control gate is ohmically connected to said second semiconducting region and one plate of said MOS coupling capacitor comprises said first electrode portion.

15. The IC of claim 12, wherein said first and said second semiconducting regions are both positioned on said dielectric surface.

16. The IC of claim 15, wherein said transistor comprises a FinFET or a trigate FET.

17. The IC of claim 12, wherein said MuGFET-EPROM comprises a planar SOI MuGFET-EPROM.

18. The IC of claim 12, wherein said transistor gate electrode layer comprises polysilicon.

19. The IC of claim 12, wherein said first electrode layer comprises a metal, and said transistor comprises a replacement metal gate transistor.

* * * * *